(12) United States Patent
Rhodes et al.

(10) Patent No.: US 8,105,864 B2
(45) Date of Patent: *Jan. 31, 2012

(54) METHOD OF FORMING BARRIER REGIONS FOR IMAGE SENSORS

(75) Inventors: Howard E. Rhodes, Sunnyvale, CA (US); Richard A. Mauritzson, Meridian, ID (US); William T. Quinlin, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 434 days.

This patent is subject to a terminal disclaimer.

(21) Appl. No.: 11/600,891

(22) Filed: Nov. 17, 2006

(65) Prior Publication Data

US 2007/0063301 A1  Mar. 22, 2007

Related U.S. Application Data

(60) Division of application No. 11/183,853, filed on Jul. 19, 2005, now Pat. No. 7,902,624, and a continuation-in-part of application No. 10/768,652, filed on Feb. 2, 2004, now Pat. No. 7,002,231.

(60) Provisional application No. 60/606,148, filed on Sep. 1, 2004.

(51) Int. Cl.
*H01L 21/00* (2006.01)

(52) U.S. Cl. .................... 438/79; 257/446; 257/E27.139

(58) Field of Classification Search .......... 257/230–232, 257/443–446, E27.139, E27.145, E27.162; 438/75, 78, 79

See application file for complete search history.

(56) References Cited

U.S. PATENT DOCUMENTS

| | | | |
|---|---|---|---|
| 3,786,264 A | 1/1974 | Ferro et al. | |
| 3,959,646 A | 5/1976 | De Cremoux | |
| 4,227,098 A * | 10/1980 | Brown et al. | 307/117 |
| 5,013,904 A * | 5/1991 | Muro | 250/214 R |
| 5,200,639 A | 4/1993 | Ishizuka et al. | |
| 5,214,272 A | 5/1993 | Ueno | |
| 5,553,616 A * | 9/1996 | Ham et al. | 600/316 |
| 5,838,469 A * | 11/1998 | Campbell et al. | 359/21 |
| 6,198,087 B1 | 3/2001 | Boon | |
| 6,297,070 B1 * | 10/2001 | Lee et al. | 438/57 |
| 6,344,877 B1 | 2/2002 | Gowda et al. | |
| 6,365,926 B1 | 4/2002 | Guidash | |
| 6,465,859 B1 * | 10/2002 | Fujiwara et al. | 257/435 |
| 6,611,037 B1 * | 8/2003 | Rhodes | 257/466 |
| 6,653,617 B2 | 11/2003 | Hiyama et al. | |

(Continued)

FOREIGN PATENT DOCUMENTS

JP          04091472 A  *  3/1992

(Continued)

*Primary Examiner* — William F Kraig
(74) *Attorney, Agent, or Firm* — David C. Kellogg

(57) ABSTRACT

Embodiments of the invention provide an image sensor that includes a barrier region for isolating devices. The image sensor comprises a substrate and an array of pixel cells formed on the substrate. Each pixel cell comprises a photoconversion device. The array comprises a first pixel cell having a first configuration, a second pixel cell having a second configuration, and at least one barrier region formed between the first and second pixel cells for capturing and removing charge. The barrier region comprises a charge accumulation region of a particular conductivity type in a substrate electrically connected to a voltage source terminal. The charge accumulation region accumulates charge and prevents charge transference from a pixel cell or peripheral circuitry on one side of the barrier region to a pixel cell on another side of the barrier region.

21 Claims, 12 Drawing Sheets

U.S. PATENT DOCUMENTS

| | | | |
|---|---|---|---|
| 6,707,495 B1 * | 3/2004 | Harada | 348/302 |
| 6,721,005 B1 * | 4/2004 | Higuchi | 348/243 |
| 6,723,994 B2 * | 4/2004 | Akahori | 250/370.08 |
| 6,724,022 B1 | 4/2004 | Yoshida | |
| 6,760,073 B1 | 7/2004 | Nakashiba | |
| 6,818,930 B2 | 11/2004 | Mouli et al. | |
| 7,002,231 B2 * | 2/2006 | Rhodes et al. | 257/446 |
| 7,015,448 B2 | 3/2006 | Barna | |
| 7,053,458 B2 | 5/2006 | Mann et al. | |
| 7,078,751 B2 | 7/2006 | Watanabe | |
| 7,172,922 B2 | 2/2007 | Benjamin et al. | |
| 7,349,018 B2 | 3/2008 | Doering et al. | |
| 7,772,027 B2 * | 8/2010 | Rhodes et al. | 438/73 |
| 2001/0043274 A1 * | 11/2001 | Shepherd et al. | 348/241 |
| 2002/0048837 A1 | 4/2002 | Burke et al. | |
| 2002/0158294 A1 * | 10/2002 | Fujiwara et al. | 257/431 |
| 2003/0201518 A1 | 10/2003 | Mann et al. | |
| 2003/0223004 A1 * | 12/2003 | Kubota et al. | 348/294 |
| 2004/0000681 A1 | 1/2004 | Shinohara et al. | |
| 2004/0004254 A1 * | 1/2004 | Watanabe | 257/347 |
| 2004/0094784 A1 | 5/2004 | Rhodes et al. | |
| 2004/0173799 A1 * | 9/2004 | Patrick | 257/72 |
| 2004/0251481 A1 | 12/2004 | Rhodes | |
| 2006/0011813 A1 * | 1/2006 | Park et al. | 250/208.1 |
| 2006/0284222 A1 * | 12/2006 | Hong et al. | 257/292 |
| 2007/0246788 A1 * | 10/2007 | Mauritzson et al. | 257/431 |

FOREIGN PATENT DOCUMENTS

| | | | |
|---|---|---|---|
| JP | 05129572 A | * | 5/1993 |
| JP | 05244513 A | * | 9/1993 |

* cited by examiner

METHOD OF FORMING BARRIER REGIONS FOR IMAGE SENSORS

CROSS-REFERENCE TO RELATED APPLICATION

This application is a divisional application of U.S. patent application Ser. No. 11/183,853, filed Jul. 19, 2005 now U.S. Pat. No. 7,902,624, which claims priority to provisional application Ser. No. 60/606,148, filed Sep. 1, 2004, and is a continuation-in-part of U.S. patent application Ser. No. 10/768,652, filed Feb. 2, 2004 now U.S. Pat. No. 7,002,231, the contents of which are incorporated herein by reference.

FIELD OF THE INVENTION

The present invention relates to the field of semiconductor devices, particularly to improved isolation techniques for image sensors.

BACKGROUND OF THE INVENTION

An image sensor generally includes an array of pixel cells. Each pixel cell includes a photo-conversion device for converting light incident on the array into electrical signals. An image sensor also typically includes peripheral circuitry for controlling devices of the array and for converting the electrical signals into a digital image.

FIG. 1 is a top plan view block diagram of a portion of a typical CMOS image sensor 10, while FIG. 2A is a top plan view of one pixel cell 20 and FIG. 2B is a schematic diagram of the pixel cell 20. Image sensor 10 includes an array 11 of pixel cells 20. The pixel cells 20 are arranged in columns and rows (not shown). The array 11 includes pixel cells 20 in an active array region 12 and pixel cells 20 in a black region 13. The black region 13 is similar to the active array region 12, except that light is prevented from reaching the photo-conversion devices of the pixel cells 20 in the black region 13 by, for example, a metal layer, a black color filter array, or any opaque material (not shown). Signals from pixel cells of the black region 13 can be used to determine the black level for the array 11, which is used to adjust the resulting image produced by the image sensor 10.

FIG. 2A is a top plan view of a conventional pixel cell 20. FIG. 2B is a schematic diagram of the pixel cell of FIG. 2A. As is known in the art, a pixel cell 20 functions by receiving photons of light and converting those photons into charge carried by electrons. For this, each one of the pixel cells 20 includes a photo-conversion device 21, which is shown as a photodiode, but can be a photogate, photoconductor, or other photosensitive device. The photodiode 21 includes a photodiode charge accumulation region 22 and a p-type surface layer 24.

Each pixel cell 20 also includes a transfer transistor 27 for transferring charge from the photodiode charge accumulation region 22 to a floating diffusion region 25 and a reset transistor 28, for resetting the diffusion region 25 to a predetermined charge level, Vaa-pix, prior to charge transfer. The pixel cell 20 also includes a source follower transistor 29 for receiving and amplifying a charge level from the diffusion region 25 and a row select transistor 26 for controlling the readout of the pixel cell 20 contents from the source follower transistor 29. As shown in FIG. 2A, the reset transistor 28, source follower transistor 29 and row select transistor 26 include source/drain regions 60.

Several contacts 23 provide electrical connections for the pixel cell 20. For example, as shown in FIG. 2, a source/drain region of the reset transistor 28 is electrically connected to an array voltage source terminal, Vaa-pix through a first contact 23; the gate of the source follower transistor is connected to the floating diffusion region 25 through a second contact 23; and an output voltage Vout is output from the pixel cell 20 through a third contact 23.

Referring again to FIG. 1, after pixel cells of array 11 generate charge in response to incident light, electrical signals indicating charge levels are read out and processed by circuitry 15 peripheral to array 11. Peripheral circuitry 15 typically includes row select circuitry 16 and column select circuitry 17 for activating particular rows and columns of the array 11; and other peripheral circuitry 18, which can include analog signal processing circuitry, analog-to-digital conversion circuitry, and digital logic processing circuitry. Peripheral circuitry 15 can be located adjacent to the array 11 as shown in FIG. 1.

In order to obtain a high quality image, it is important that the peripheral circuitry 15 not interfere with the pixel cells 20 of the array 11. During operation, the peripheral circuitry 15 can generate charge carriers, e.g., electrons. If the peripheral circuitry 15 is adjacent to the array 11, electrons generated by the peripheral circuitry 15 can travel to and interfere with array pixel cells 20, especially those pixel cells 20 on the edges of the array 11 adjacent the peripheral circuitry 15. The interfering electrons are misinterpreted as a true pixel signal and image distortion can occur.

Another problem encountered in the conventional image sensor 10 is interference from the active array region 12 with the black region 13. When very bright light is incident on active region 12 pixel cells 20 adjacent to the black region 13, blooming can occur and excess charge from the active region 12 pixel cells 20 can travel to and interfere with pixel cells 20 in the adjacent black region 13. This can cause inaccurate black levels and distortion of the resultant image.

Accordingly, it would be advantageous to have an improved image sensor with reduced interference.

BRIEF SUMMARY OF THE INVENTION

Embodiments of the invention provide an image sensor that includes a barrier region for isolating devices. The image sensor comprises a substrate and an array of pixel cells formed on the substrate. Each pixel cell comprises a photo-conversion device. The array comprises a first pixel cell having a first configuration, a second pixel cell having a second configuration, and at least one barrier region formed between the first and second pixel cells for capturing and removing charge. The barrier region comprises a charge accumulation region of a particular conductivity type in a substrate electrically connected to a voltage source terminal. The charge accumulation region accumulates charge and prevents charge transference from a pixel cell or peripheral circuitry on one side of the barrier region to a pixel cell on another side of the barrier region.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

Figure 1:
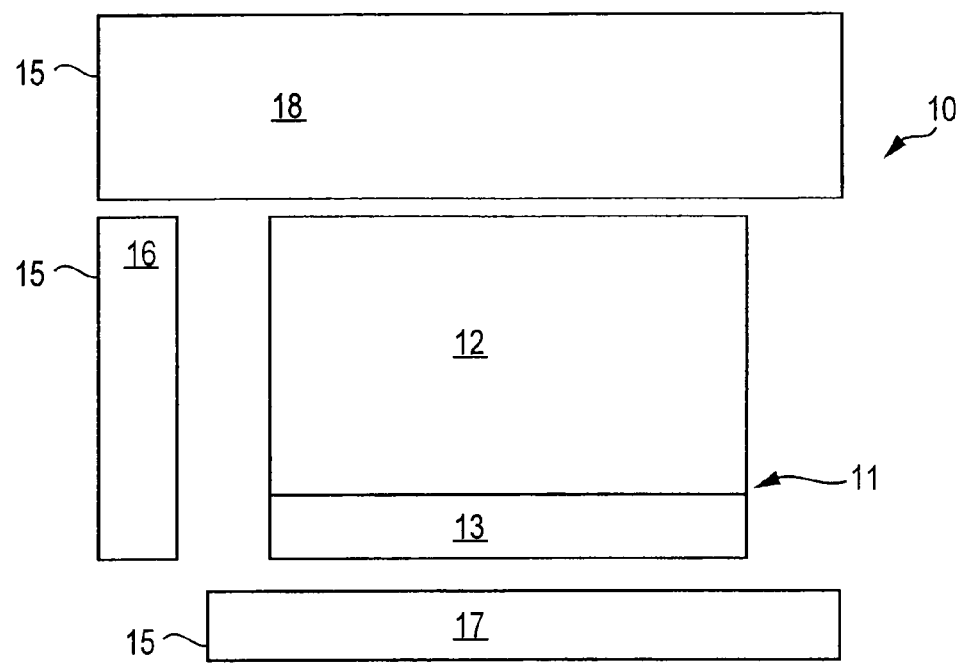
FIG. 1 is a top plan view block diagram of a conventional image sensor.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" or "pixel cell" refers to a picture element unit cell containing a photo-conversion device for converting electromagnetic radiation to an electrical signal. Typically, the fabrication of all pixel cells in an image sensor will proceed concurrently in a similar fashion.

Figure 3A:
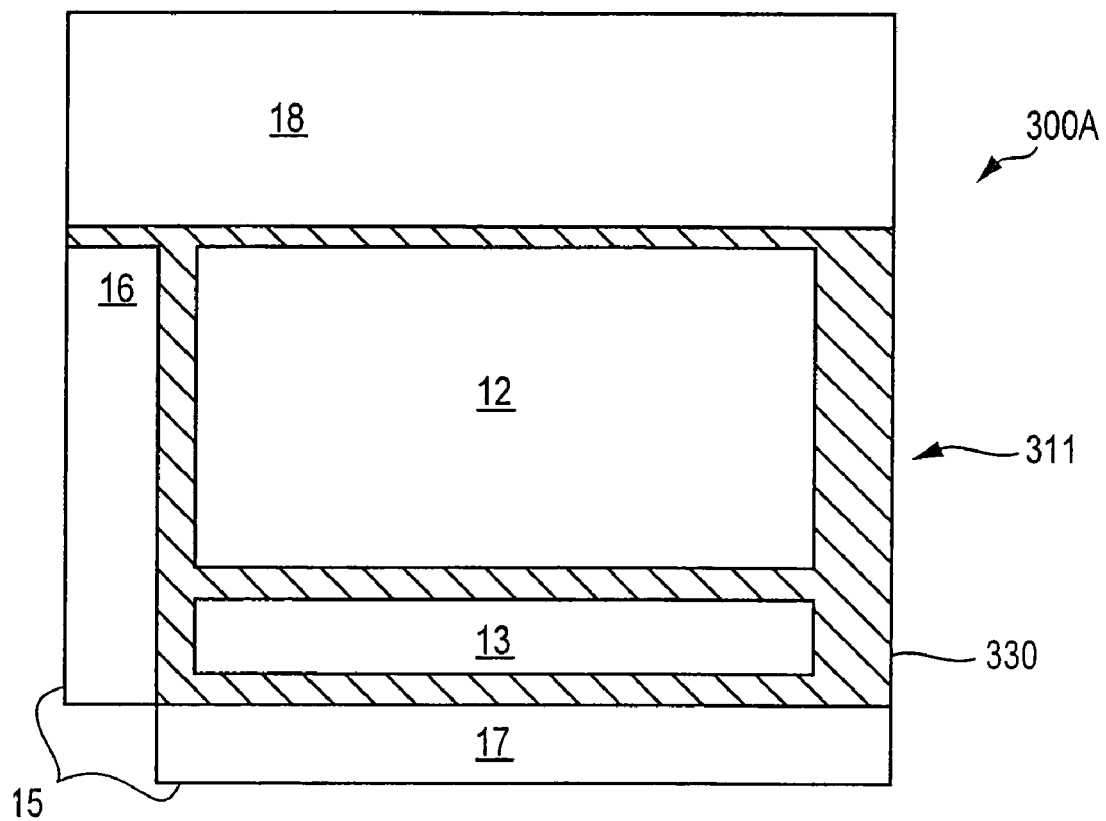
FIGS. 3A and 3B are top plan view block diagrams of image sensors according to exemplary embodiments of the invention.

Referring to the drawings, FIG. 3A depicts an image sensor 300a according to an exemplary embodiment of the invention. Image sensor 300a includes a pixel array 311 comprising an active array region 12 and black region 13. There is also peripheral circuitry 15 adjacent to the array 311. As shown in FIG. 3, the peripheral circuitry can include row select circuitry 16 and column select circuitry 17 for activating particular rows and columns of the array 11; and other peripheral circuitry 18, which can include analog signal processing circuitry, analog-to-digital conversion circuitry, and digital logic processing circuitry. The configuration of image sensor 300a is exemplary only. Accordingly, image sensor 300a need not include peripheral circuitry 15 adjacent to the array 311 and/or array 311 need not include black region 13.

Figure 3B:
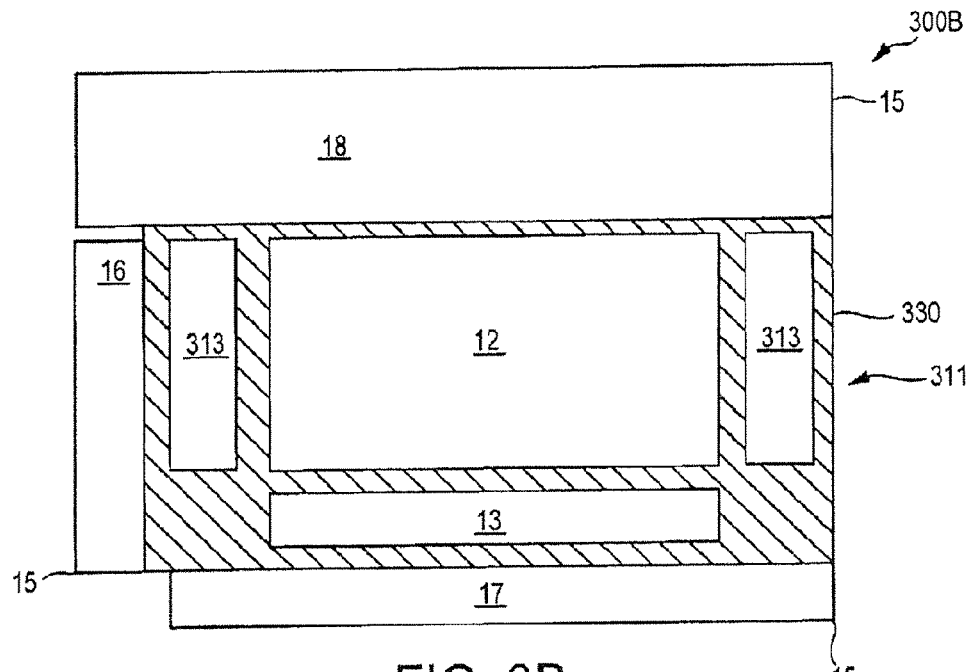

FIG. 3B depicts an image sensor 300b according to another exemplary embodiment of the invention. The image sensor 300b is similar to the image sensor 300a, except that image sensor 300b includes additional black regions 313a and 313b. Like black region 13, the black regions 313a and 313b also include pixel cells 20 where light is prevented from reaching the photo-conversion devices of the pixel cells 20 in the black regions 313a and 313b by, for example, a metal layer, a black color filter array, or any opaque material (not shown). The black regions 313a and 313b operate in the same manner as black region 13. Therefore, without isolation the black regions 313a and 313b can experience interference from pixel cells of active array region 12 or peripheral circuitry 15.

Illustratively, image sensors 300a and 300b are CMOS image sensors and array 311 includes CMOS pixel cells 20. It should be noted, however, that embodiments of the invention include CCD image sensors. In such a case, array 311 would instead include pixel cells and peripheral circuitry suitable for a CCD image sensor.

It should be further noted that the configuration of pixel cell 20 is only exemplary and that various changes may be made as are known in the art and pixel cell 20 may have other configurations. Although the invention is described in connection with a four-transistor (4T) pixel cell 20, the invention may also be incorporated into other pixel circuits having different numbers of transistors. Without being limiting, such a circuit may include a three-transistor (3T) pixel cell, a five-transistor (5T) pixel cell, a six-transistor (6T) pixel cell, and a seven-transistor pixel cell (7T). A 3T cell omits the transfer transistor, but may have a reset transistor adjacent to a photodiode. The 5T, 6T, and 7T pixel cells differ from the 4T pixel cell by the addition of one, two, or three transistors, respectively, such as a shutter transistor, a CMOS photogate transistor, and an anti-blooming transistor.

As shown in FIGS. 3A and 3B, array 311 includes a barrier area 330. Illustratively, the barrier area 330 surrounds each one of the active array region 12 and black region 13, black regions 313a and 313b (FIG. 3B), as well as the array 311 as a whole. It should be understood, however, that barrier area 330 need not surround the array 311 or each one of the active array region 12 and black region 13, black regions 313a and 313b (FIG. 3B). Instead, the barrier area can be only adjacent to any one or more of, or any portion of, active array region 12 and black region 13, black regions 313a and 313b (FIG. 3B), or the array 311 as a whole. That is, barrier area 311 can be between any one or more of, or any portion of, active array region 12 and black region 13, black regions 313a and 313b (FIG. 3B), or the array 311 and adjacent peripheral circuits, e.g., peripheral circuitry 15. Further, the barrier area 330 can be located beneath a light blocking layer 470 (FIG. 4A), e.g., a metal a metal layer, a black color filter array, or an opaque organic or inorganic material, in a manner like the black region 13, and black regions 313a and 313b (FIG. 3B).

Figure 4A:
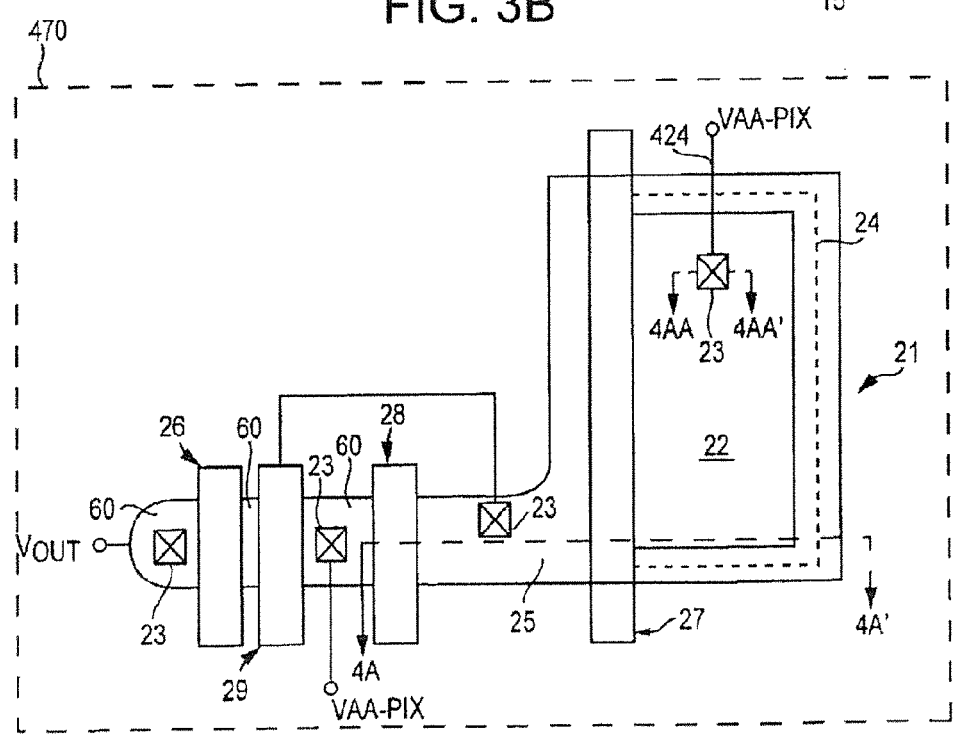
FIG. 4A is a top plan view of a barrier region according to an exemplary embodiment of the invention.
Figure 4B:
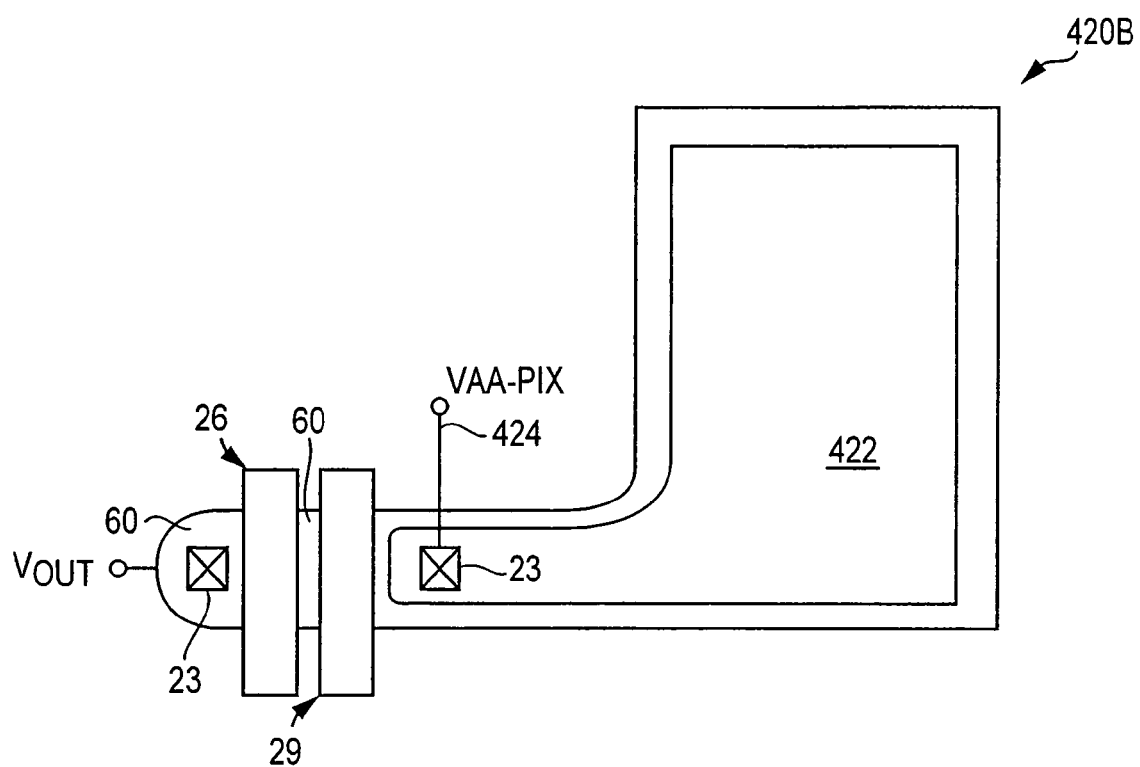
FIG. 4B is a top plan view of a barrier region according to another exemplary embodiment of the invention.
Figure 4C:
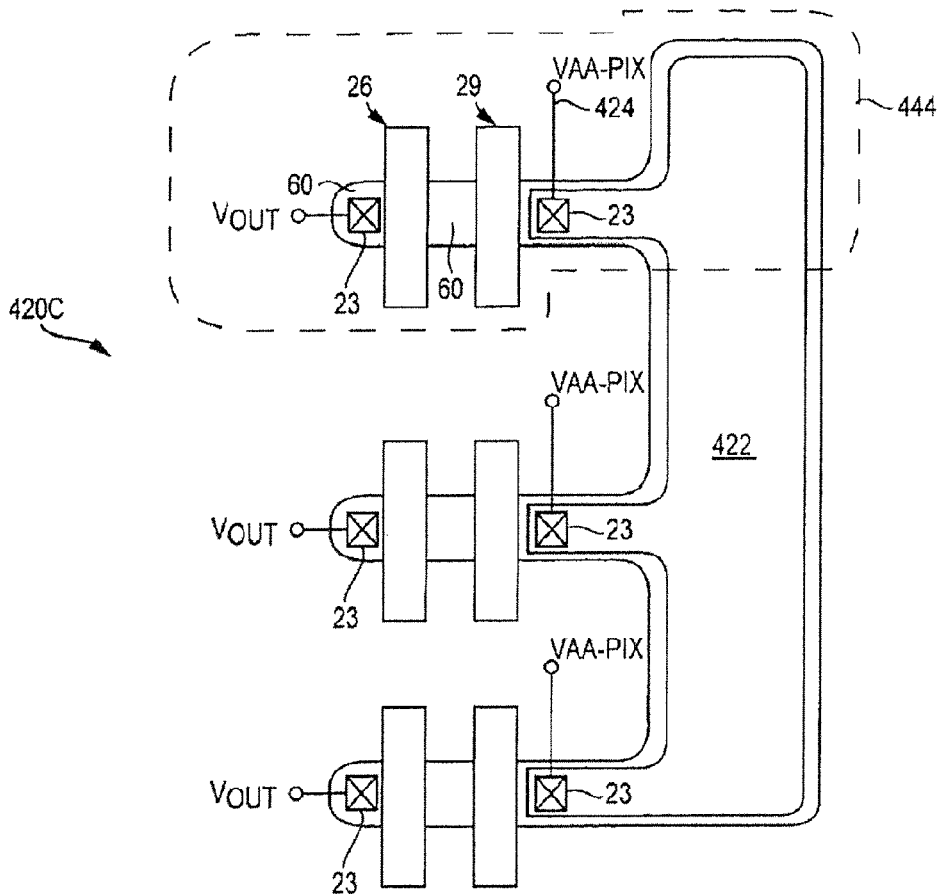
FIG. 4C is a top plan view of a barrier region according to another exemplary embodiment of the invention.
Figure 4D:
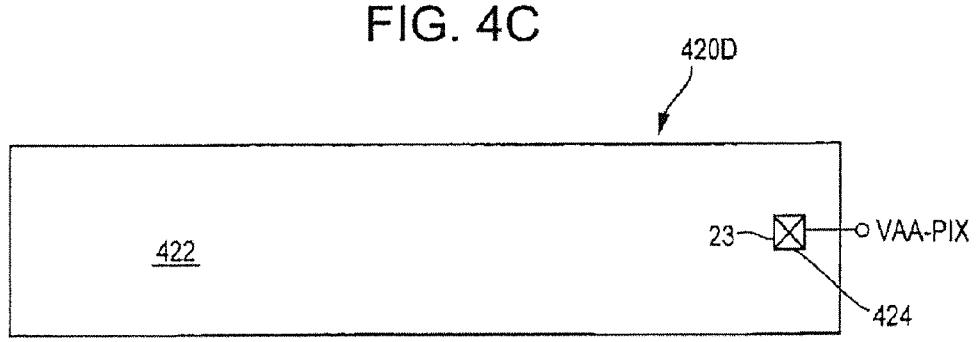
FIG. 4D is a top plan view of a barrier region according to another exemplary embodiment of the invention.

The barrier area 330 includes one or more barrier regions 420a (FIG. 4A), 420b (FIG. 4B), 420c (FIG. 4C), and/or 420d (FIG. 4D). Each barrier region 420a, 420b, 420c, 420d comprises a charge accumulation region 422 electrically connected to a voltage source terminal. In the exemplary embodiments depicted in FIGS. 3-6, the pixel cells 20 of array 311 are formed using NMOS transistors, e.g., row select transistor 26. Accordingly, charge accumulation region 422 is an n-type region at a surface of a substrate 501 (FIG. 5A) and is connected to a positive voltage source terminal, e.g., Vaa-pix. In another embodiment, the pixel cells 20 of array 311 could include PMOS transistors, and charge accumulation region 422 would be a p-type region connected to a ground voltage source terminal.

Each barrier region 420a, 420b, 420c, 420d collects charge in the charge accumulation region 422 and the charge is drained from the barrier region to the voltage source terminal.

In this manner, the barrier regions 420a, 420b, 420c, 420d serve to isolate adjacent structures and prevent interference from excess charge. For example, in the embodiment of FIGS. 3A and 3B, the barrier regions 420a (FIG. 4A), 420b (FIG. 4B), 420c (FIG. 4B), 420d (FIG. 4D) of barrier area 330 isolate the active array region 12 from the peripheral circuitry 15. Thereby, barrier regions 420a, 420b, 420c, 420d prevent charge generated by the peripheral circuitry 15 from interfering with pixel cells 20 of the active array region 12. Also, the barrier regions 420a, 420b, 420c, 420d isolate the black region 13, and black regions 313b, 313c (FIG. 3B) from the active array region 12. Thereby, barrier regions 420a, 420b, 420c, 420d prevent excess charge from pixel cells 20 of the active array region 12 from interfering with the pixel cells 20 of the black region 13, and black regions 313b, 313c (FIG. 3B).

FIGS. 4A-4D illustrate barrier regions 420a, 420b, and 420c, 420d respectively, according to exemplary embodiments of the invention, which can be formed by modifying pixel cells 20 to be operative for isolation rather than for the production of a pixel signal.

FIG. 4A depicts a barrier region 420 according to an exemplary embodiment of the invention. As shown in FIG. 4A, barrier region 420a is configured similarly to pixel cell 20. Accordingly, like pixel cell 20, barrier region 420a includes a transfer transistor 27, a reset transistor 28, a source follower transistor 29, a row select transistor 26, and a floating diffusion region 25. The barrier region 420a also includes a charge accumulation region 422, which is analogous to the photodiode charge accumulation region 22 of pixel cell 20. The barrier region 420a can also include an optional p-type surface layer 24 over the charge accumulation region 422. In addition to the structure of pixel cell 20, the barrier region 420a includes a contact 23 and a connection 424 through which the charge accumulation region 422 is connected to Vaa-pix, or any positive voltage source terminal.

As shown in FIG. 4A, barrier region 420a can be located below a light blocking layer 470. Light blocking layer 470 can be, for example, a metal layer, a black color filter array, or an opaque organic or inorganic material. Light blocking layer 470 can be common to the barrier layer 420a, the black region 13 (FIG. 3A), and black regions 313a and 313b (FIG. 3B). For simplicity, only barrier region 420A is shown below a light blocking layer 470. It should be understood, however, that any barrier region 420a, 420b, 420c, 420d can be located below light blocking layer 470.

Except for the charge accumulation region 422, the contact 23, and connection 424 to Vaa-pix, the other illustrated structures of barrier region 420a are not necessary to achieve improved isolation according to the invention. However, forming barrier region 420a with a similar configuration to pixel cell 20 may provide advantages in the fabrication of array 311, and particularly during photolithographic, patterning, and etching processes. Printing, patterning, and etching similar features adjacent to the active array region 12 and black regions 13, 313b, 313c better ensures accurate formation of the pixel cells 20 at the edges of the active array region 12 and black regions 13, 313b, 313c.

For purposes of this description, when a barrier region, e.g., barrier regions 420a (FIG. 4A), 420c (FIG. 4B), 420c (FIG. 4C), has a structure similar to pixel cells 20, the barrier region has a configuration based on the pixel cells 20. That is, the barrier region is configured as at least a portion of a pixel cell 20 in the array 311.

As shown in FIG. 4B, barrier region 420b has a similar configuration to that of the pixel cell 20. Like pixel cell 20, the barrier region 420b includes a row select transistor 26 and a source follower transistor 29. Also, the charge accumulation region 422 is similar to the photodiode charge accumulation region 22, except that charge accumulation region 422 extends to the contact 23 connected by connection 424 to Vaa-pix. Because the charge accumulation region 422 is thus extended, the transfer transistor 27 and the reset transistor 28 are omitted from barrier region 420a. As noted above, the charge accumulation region 422 could instead be connected to any positive voltage source terminal.

The barrier region 420b can also serve to ensure accurate formation of the pixel cells 20 at the edges of the active array region 12 and black regions 13, 313b, 313c, since the features of barrier region 420b can be made similar to those adjacent to the active array region 12 and black regions 13, 313b, 313c. Additionally, by providing an extended charge accumulation region 422, charge accumulation, and, therefore, isolation, can be further improved.

FIG. 4C illustrates a barrier region 420c according to another exemplary embodiment of the invention. The barrier region 420c is similar to barrier region 420a, except that the illustrated barrier region 420c includes a plurality of the FIG. 4B barrier region 420b structures, or, for clarity, sub-regions 444, joined with a single, continuous charge accumulation region 422. Accordingly, like barrier region 420b, the configuration of barrier region 420c is based on the configuration of the array pixel cells 20. Therefore, the barrier region 420c includes a plurality of row select transistors 26 and a source follower transistors 29; contacts 23; connections 424; and connections to Vaa-pix, or any positive voltage source terminal.

Illustratively, the barrier region 420c includes three sub-regions 444 joined with a single, continuous charge accumulation region 422, but barrier region 420c can include two or more of the sub-regions 444 joined with a single, continuous charge accumulation region 422. Specifically, an entire row or column of array 311 can be formed as a barrier region 420b. As shown in FIG. 4C, the sub-regions 444 can be stacked horizontally, in the column direction. In an alternative embodiment, barrier region 420c can include sub-regions 444 adjoined in other orientations, for example, in the row direction or back-to-back, such that the barrier region 420c includes a first sub-region 444 and a second sub-region 444 in a mirror-image orientation to the first sub-region 444.

The barrier region 420c can also serve to ensure accurate formation of the pixel cells 20 at the edges of the active array region 12 and black regions 13, 313b, 313c, since the features of barrier region 420c can be made similar to those adjacent to the active array region 12 and black regions 13, 313b, 313c. Additionally, by providing a continuous charge accumulation region 422, charge accumulation, and, therefore, isolation, can be further improved.

FIG. 4D illustrates a barrier region 420d according to another exemplary embodiment of the invention. The barrier region 422d includes an n-type charge accumulation region 422 electrically connected to Vaa-pix through a contact 23 and connection 424. Although barrier region 420d is shown having a rectangular shape with a single connection to the array voltage source terminal Vaa-pix, the barrier region 420d can have any shape and any number of contacts 23 and connections 424 to Vaa-pix, or any positive voltage source terminal. For example, barrier region 420d can have a shape similar to a pixel cell 20, or to a group of pixel cells 20, e.g. one or more rows and/or columns of pixel cells 20, having a continuous charge accumulation region 422. Also, the barrier area 330 can include a single barrier region 420d throughout approximately the entire barrier area 330 (FIGS. 3A and 3B).

By providing a continuous charge accumulation region 422, charge accumulation, and, therefore, isolation, can be further improved.

As noted above, embodiments of the invention can include pixel cells having alternative configurations, e.g., 3T, 5T, 6T, and 7T configurations. Accordingly, when the array 311 includes pixel cells having an alternative configuration, the image sensor 300a, 300b can include barrier regions based on such an alternative configuration. In such a case, the alternatively configured pixel cell could be modified by eliminating structures and/or connecting a charge accumulation region to a voltage source terminal.

Figure 5A:
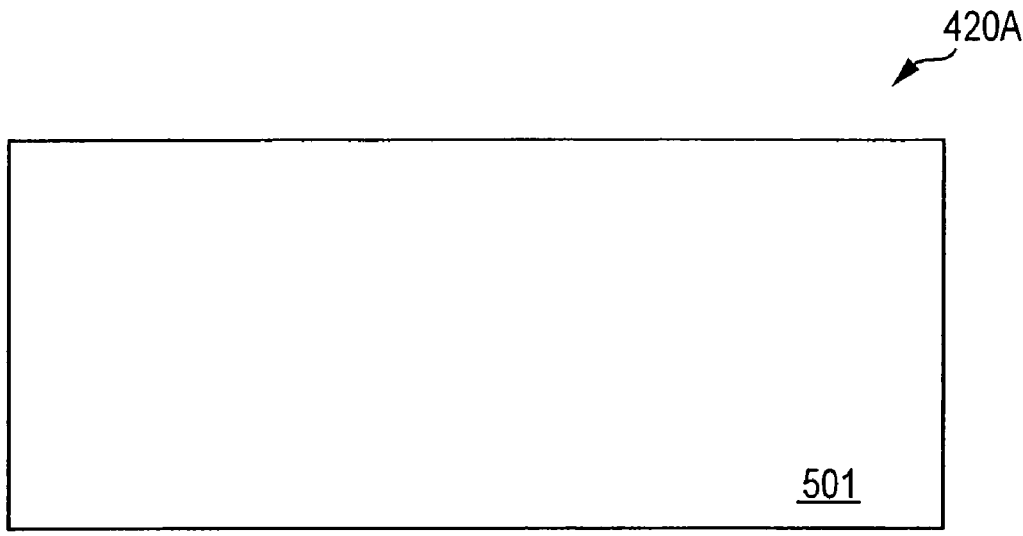
FIG. 5A depicts the formation of the barrier region of FIG. 4A at an initial stage of processing.
Figure 5B:
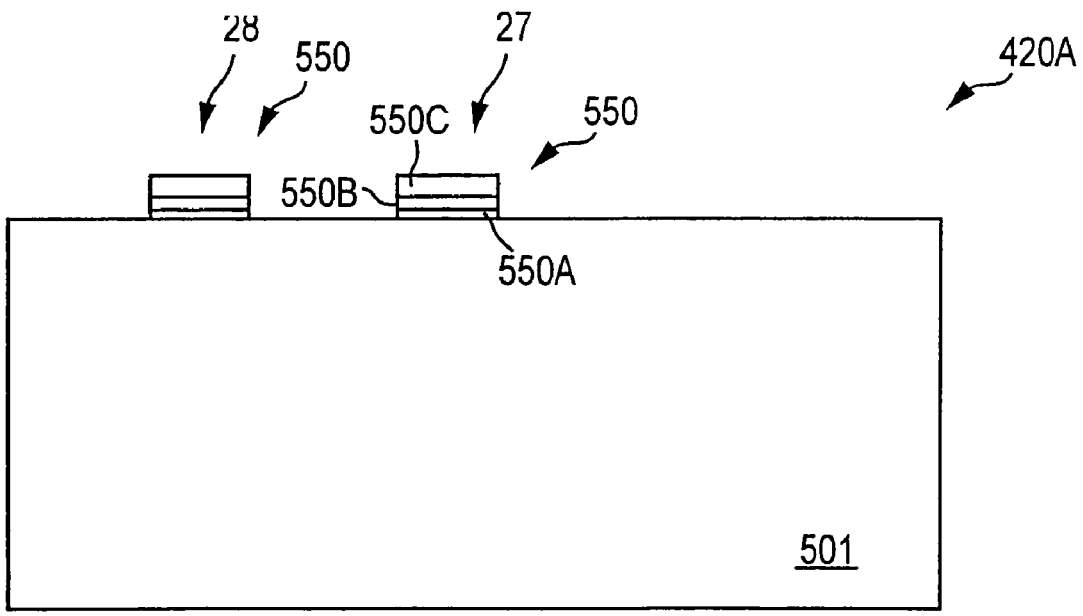
FIGS. 5B-5H depict the formation of the barrier region of FIG. 4A at intermediate stages of processing.
Figure 5C:
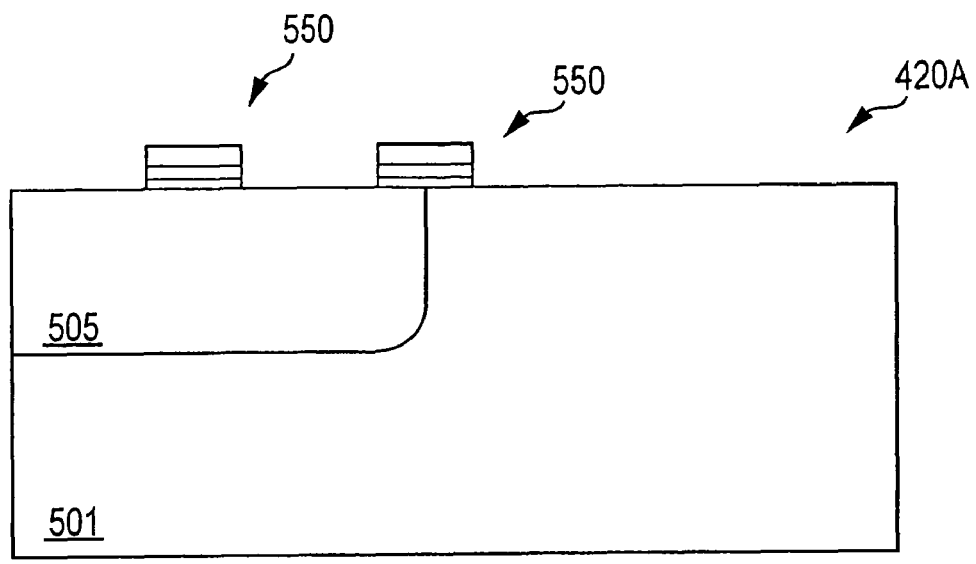
Figure 5D:
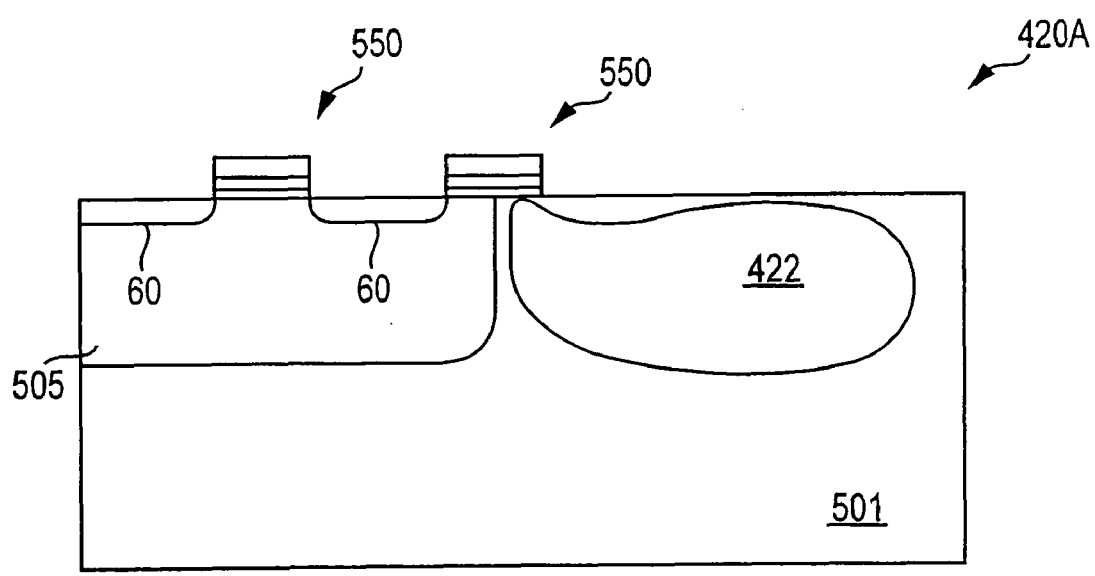
Figure 5E:
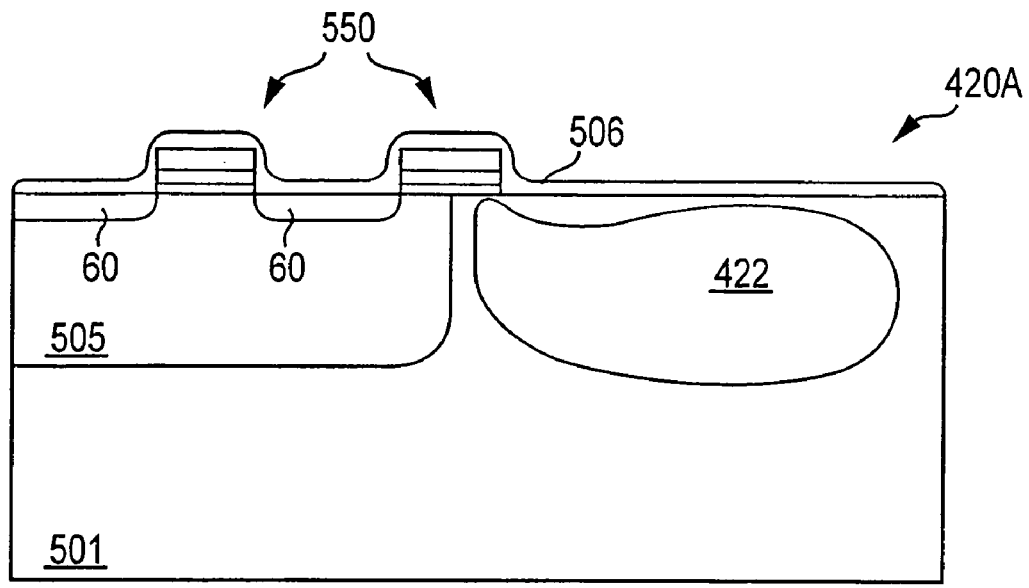
Figure 5F:
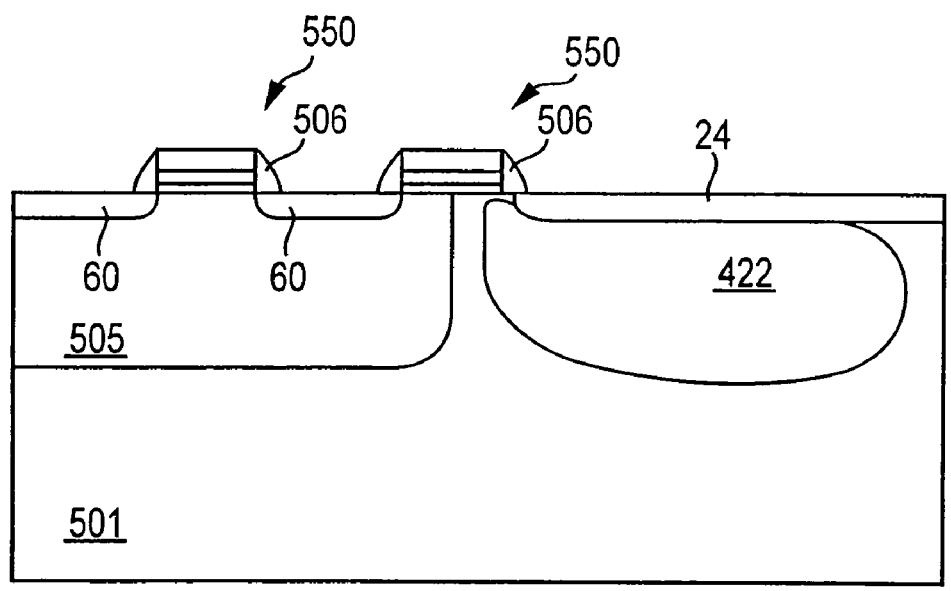
Figure 5G:
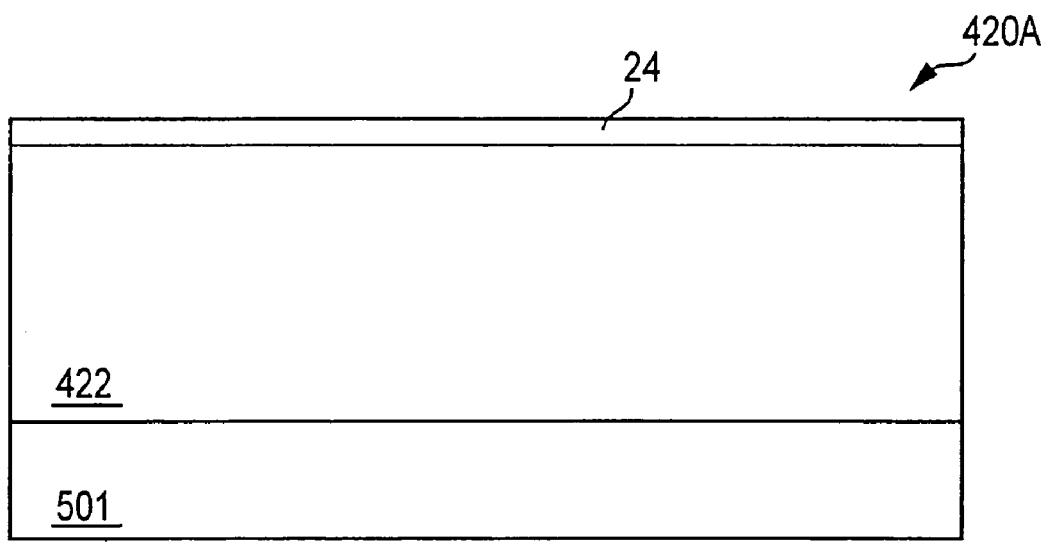
Figure 5H:
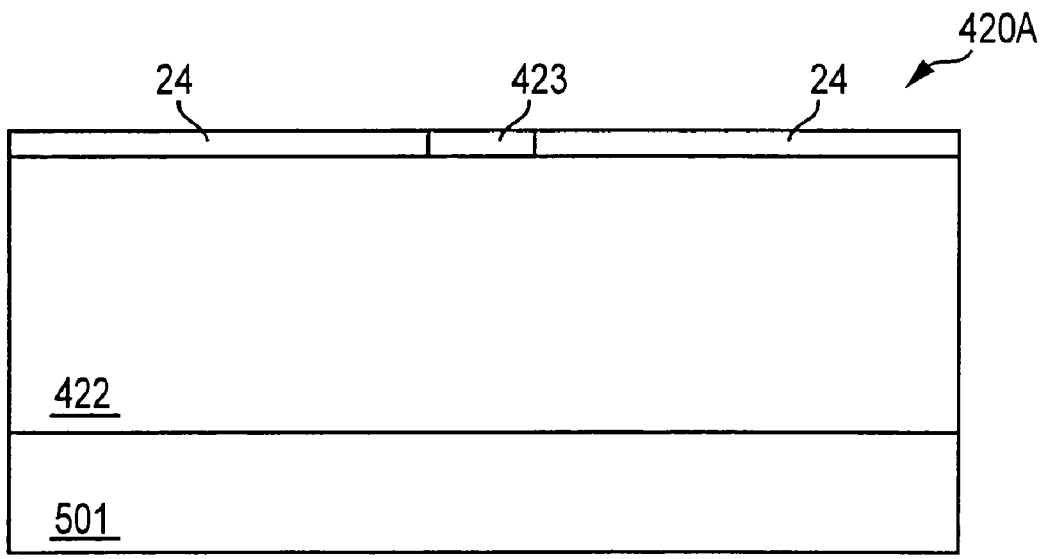

FIGS. 5A-5F depict a portion of the barrier region 420a along line 4A-4A', and FIGS. 5G and 5H depict a portion of the barrier region 420a along line 4AA-4AA'. FIGS. 5A-5H illustrate the formation of barrier region 420a (FIG. 4A) according to one exemplary embodiment of the invention. No particular order is required for any of the actions described herein, except for those logically requiring the results of prior actions. Accordingly, while the actions below are described as being performed in a general order, the order is exemplary only and can be altered.

Referring to FIGS. 4A and 5A-5H, the barrier region 420a can be formed simultaneously with the pixel cells of array 311 (FIGS. 3a and 3B). Also, the formation of a plurality of barrier regions 420a can proceed simultaneously and in a similar manner as described below in connection with FIGS. 5A-5H.

As shown in FIG. 5A, barrier region 420a is formed at a surface of a substrate 501, which is illustratively a p-type substrate. As noted above, previous process steps may have been utilized to form regions (not shown) or junctions (not shown) in the substrate 501. For example, isolation regions, e.g., shallow trench isolation regions can be formed by known techniques at a surface of the substrate 501 prior to the formation of barrier region 420a.

FIG. 5B depicts the formation of gate stacks 550 for the transfer 29 and reset transistor 28 gates. A first insulating layer 550a of, for example, silicon oxide is grown or deposited on the substrate 501. The first insulating layer 550a serves as the gate oxide layer for the subsequently formed transfer and reset transistors 27, 28. Next, a layer of conductive material 550b is deposited over the oxide layer 550a. The conductive layer 550b serves as the gate electrode for the subsequently formed transfer and reset transistors 27, 28. The conductive layer 550b can be a layer of polysilicon, which can be n-type. A second insulating layer 550c is deposited over the polysilicon layer 550b. The second insulating layer 550c can be formed of, for example, an oxide ($SiO_2$), a nitride (silicon nitride), an oxynitride (silicon oxynitride), ON (oxide-nitride), NO (nitride-oxide), or ONO (oxide-nitride-oxide).

The layers 550a, 550b, 550c, can be blanket formed by conventional deposition methods, such as chemical vapor deposition (CVD) or plasma enhanced chemical vapor deposition (PECVD), among others. The layers 550a, 550b, 550c are then patterned and etched to form the transfer and reset transistor 27, 28 multilayer gate stacks 550 shown in FIG. 5B. The formation of gate stacks 550 for barrier region 420a can be formed simultaneously with the analogous structures of pixel cells 20.

The invention is not limited to the structure of the gate stacks 550 described above. Additional layers may be added or the gate stacks 550 may be altered as is desired and known in the art. For example, a silicide layer (not shown) may be formed between the gate electrodes 550b and the second insulating layers 550c. The silicide layer may be included in the transfer and reset transistor gate stacks 550, or in all of the transistor gate structures in an image sensor circuit, and may be titanium silicide, tungsten silicide, cobalt silicide, molybdenum silicide, or tantalum silicide. This additional conductive layer may also be a barrier layer/refractor metal, such as TiN/W or W/$N_x$/W, or it could be formed entirely of $WN_x$.

Optionally, as illustrated in FIG. 5C, a p-type well 505 is implanted into the substrate 501. The p-well 505 is formed in the substrate 501 from a point below the transfer transistor 27 gate stack 550 and extending below the reset transistor 27 gate stack 550. The p-well 505 may be formed by known methods. For example, a layer of photoresist (not shown) can be patterned over the substrate 501 having an opening over the area where a p-well 505 is to be formed. A p-type dopant, such as boron, can be implanted into the substrate 501 through the opening in the photoresist. Illustratively, the p-well 505 is formed having a p-type dopant concentration that is higher than adjacent portions of the substrate 501.

As depicted in FIG. 5D, the charge accumulation region 422 is implanted in the substrate 501. The charge accumulation region 422 is, illustratively, a lightly doped n-type region. The implant dose in the charge accumulation region is within the range of approximately $5\times10^{11}$ to approximately $1\times10^{14}$ atoms/cm$^2$, and preferably is within the range of approximately $2\times10^{12}$ atoms/cm$^2$ to approximately $1\times10^{14}$ atoms/cm$^2$. In another embodiment, the charge accumulation region 422 can be a heavily doped n+ region, and the implant dose can be greater than approximately $1\times10^{14}$ atoms/cm$^2$. For example, a layer of photoresist (not shown) may be patterned over the substrate 501 having an opening over the surface of the substrate 501 where charge accumulation region 422 is to be formed. An n-type dopant, such as phosphorus, arsenic, or antimony, may be implanted through the opening and into the substrate 501. Multiple implants may be used to tailor the profile of region 422. If desired, an angled implantation may be conducted to form the region 422, such that implantation is carried out at angles other than 90 degrees relative to the surface of the substrate 501. The charge accumulation region 422 can be formed simultaneously with the photodiode charge accumulation regions 22 of pixel cells 20.

The floating diffusion region 25 and the reset transistor 28 source/drain region 60 are implanted by known methods to achieve the structure shown in FIG. 5D. The floating diffusion region 25 and source/drain region 60 are formed as n-type regions adjacent the gate stacks 550. The floating diffusion region 25 is formed between the transfer transistor 27 gate stack 550 and the reset transistor 28 gate stack 550, while the source/drain region 60 is formed adjacent to the reset transistor 28 gate stack 550 and opposite to the floating diffusion region 25. Any suitable n-type dopant, such as phosphorus, arsenic, or antimony, may be used. The source/drain region 60 can be formed simultaneously with source/drain regions 60 of pixel cells 20.

Referring to FIG. 5E, a dielectric layer 506 is formed over the substrate 501 and the gate stacks 550. Illustratively, layer 506 is an oxide layer, but layer 506 may be any appropriate dielectric material, such as silicon dioxide, silicon nitride, an oxynitride, ON, NO, ONO, or TEOS, among others, formed by methods known in the art.

As depicted in FIG. 5F, a dry etch step is conducted to etch portions of the oxide layer 506 such that only sidewall spacers 506 on gate stacks 550 remain. Alternatively, oxide layer 506 may be etched such that remaining portions form a sidewall spacer 506 on a sidewall of reset transistor 28 gate stack 550 and a protective layer (not shown) extending from the top of reset transistor 28 gate stack 550 over the transfer transistor 27 gate stack 500 and the charge accumulation region 422.

Figure 2A:
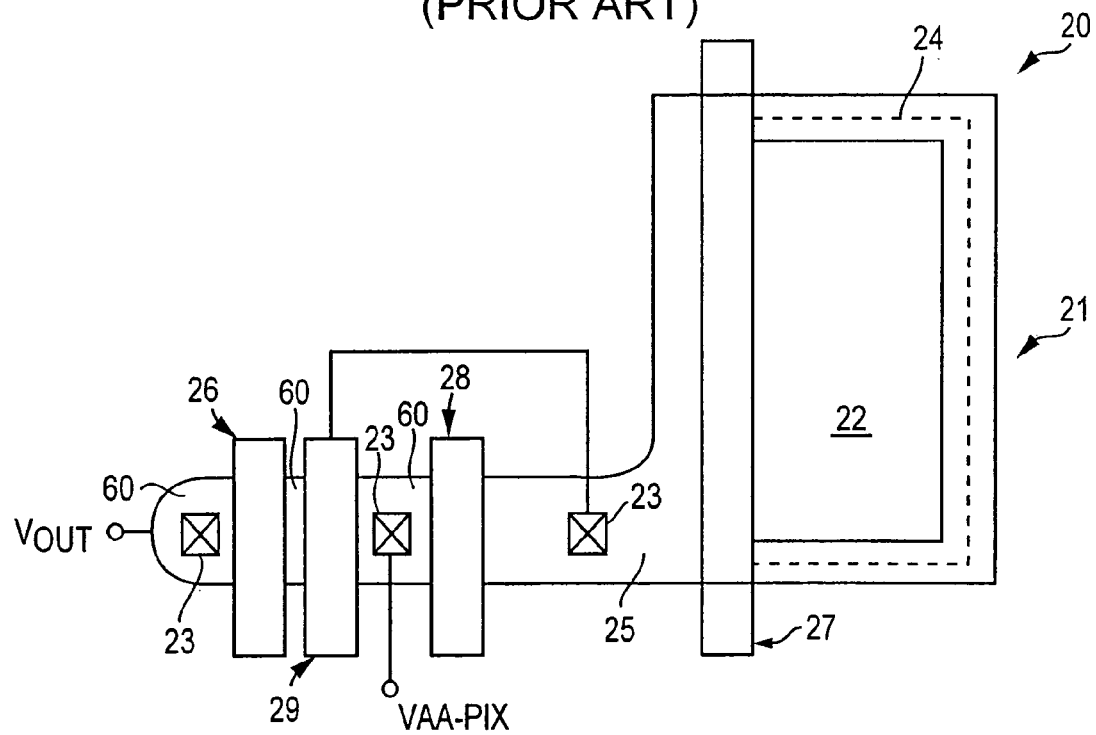
FIG. 2A is a top plan view of a conventional CMOS pixel cell.
Figure 2B:
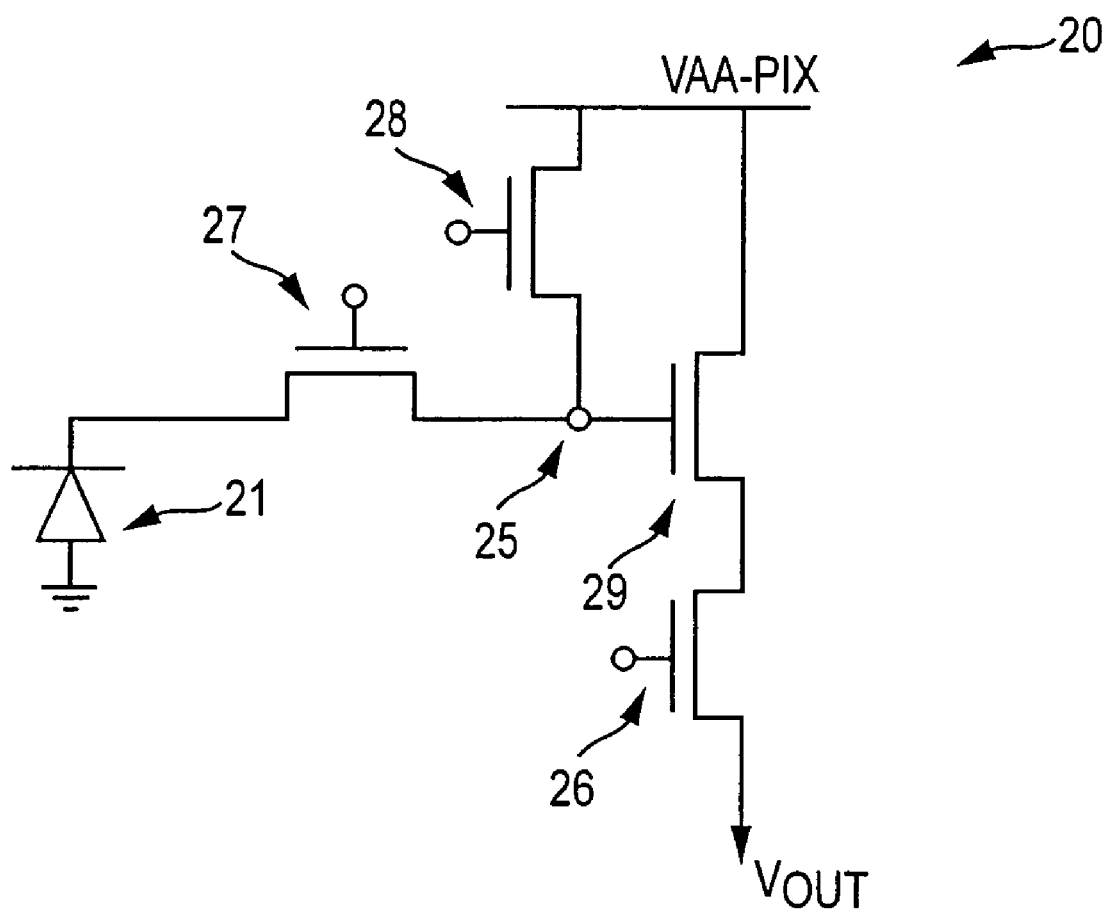
FIG. 2B is a schematic diagram of the pixel cell of FIG. 2A.

Optionally, a p-type surface layer 24, analogous to the p-type surface layer 24 of the photodiode 21 of pixel cell 20 (FIG. 2A), can be implanted, as shown in FIG. 5F. The doped surface layer 24 is doped to the first conductivity type. Illustratively, doped surface layer 24 is a highly doped p+ surface layer. A p-type dopant, such as boron, indium, or any other suitable p-type dopant, may be used to form the p+ surface layer 24.

The p+ surface layer 24 may be formed by known techniques. For example, layer 24 may be formed by implanting p-type ions through openings in a layer of photoresist. Alternatively, layer 24 may be formed by a gas source plasma doping process, or by diffusing a p-type dopant into the substrate 501 from an in-situ doped layer or a doped oxide layer deposited over the area where layer 24 is to be formed.

Conventional processing methods may be used to complete the barrier region 420a. For example, a light blocking layer 470 of a metal layer, a black color filter array, or an opaque organic or inorganic material can be formed by known techniques over the barrier region 420a to prevent light from reaching the barrier layer 420a. Additionally, insulating, shielding, and metallization layers can be formed to connect gate lines and provide connection 424 to Vaa-pix and other connections to the barrier region 420a. Further, the entire surface may be covered with a passivation layer (not shown) of, for example, silicon dioxide, BSG, PSG, or BPSG, which is CMP planarized and etched to provide contact holes, which are then metallized to provide contacts 23. Conventional layers of conductors and insulators may also be used to interconnect the structures and to connect the charge accumulation region 422 to Vaa-pix. Specifically, connection 424 can be formed using any suitable conductive material, e.g. metal; and contact 23 can be formed using any suitable conductive material.

When barrier region 420a includes an optional p-type surface layer 24, an n-type contact region 423 can be formed to provide the contact 23 a connection to the charge accumulation region 422. FIGS. 5G and 5H are cross sectional views of a portion of the barrier region 420a along line 4AA-4AA' showing the formation of the contact region 423.

FIG. 5G shows a portion of the barrier region after the processing steps described above in connection with FIG. 5F. Accordingly, at a surface of the substrate 501, there is an n-type charge accumulation region 422 below a p-type surface layer 24.

As depicted in FIG. 5H, an n-type contact region 423 is formed at a surface of the substrate 501 at a location where contact 23 to Vaa-pix is to be formed and extending from the charge accumulation region 422 to the surface of the substrate 501. The contact region 423 can be formed by known techniques. For example, a layer of photoresist (not shown) may be patterned over the substrate 501 having an opening over the surface of the substrate 501 where contact region 423 is to be formed. An n-type dopant, such as phosphorus, arsenic, or antimony, may be implanted through the opening and into the substrate 501. The implant dose in the contact region 423 can be approximately the same implant dose as used for the charge accumulation region 422 or a different implant dose. Illustratively, the contact region is an n+ region and the implant dose is greater than approximately $1 \times 10^{14}$ atoms/cm$^2$.

When barrier region 420a is formed simultaneously with pixel cells 20, barrier region 420a can be shielded from certain processing steps performed on pixel cells 20 by, for example a mask, such as photoresist. In this manner, barrier region 420a can be formed with a configuration as desired. For example, if pixel cells 20 are subjected to a p-type dopant implantation step, to form a p-type region, e.g., a p-well 505, the barrier region 420a can be shielded from this step.

The barrier regions 420b (FIG. 4B), 420c (FIG. 4C) and 420d (FIG. 4D) can be formed in a similar manner as described above in connection with FIGS. 5A-5D. To form barrier regions 420b, 420c, 420d particular steps described above in connection with FIGS. 5A-5D can be omitted or barrier regions 420b, 420c, 420d can be shielded from the particular steps.

Figure 6:
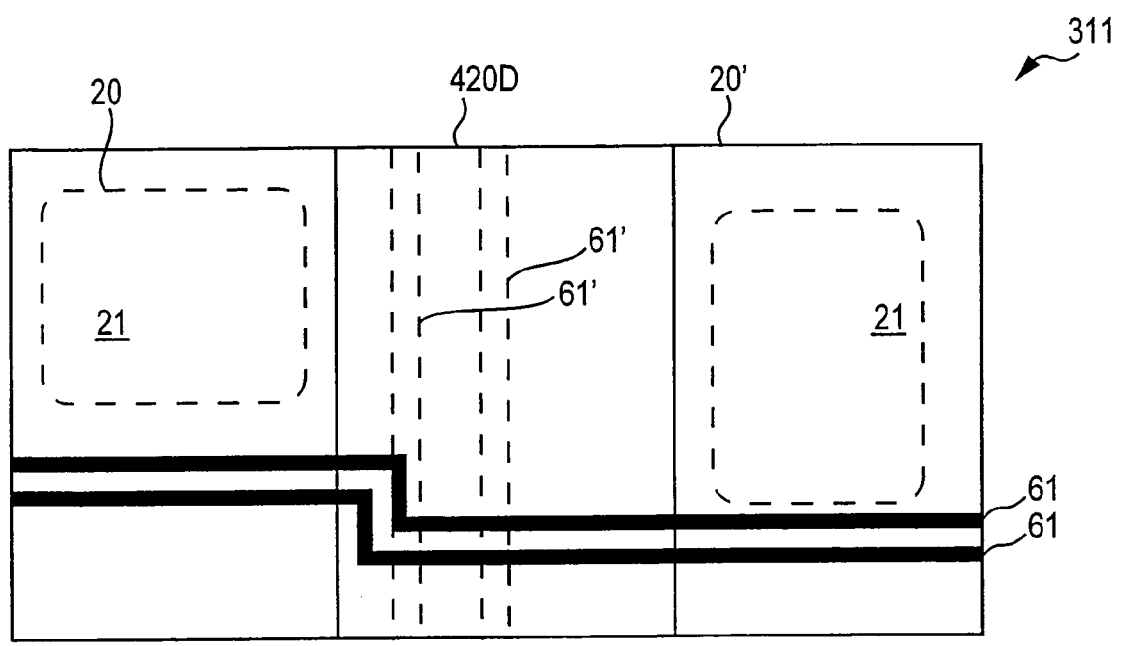
FIG. 6 is a top plan view block diagram of a portion of an image sensor array according to another embodiment of the invention.

FIG. 6 is a top plan view block diagram of a portion of the array 311 according to another exemplary embodiment of the invention. As in a conventional image sensor 10 (FIG. 1), the image sensors 300a, 300b (FIGS. 3A and 3B) can include wiring layers 61, 61' over the pixel cells 20, 20' to route electrical signals to particular destinations. Typically, such wiring layers 61, 61' are in the form of metal layers, which block light. Therefore, wiring layers 61, 61' are not formed over the photodiodes 21 of the pixel cells 20, 20'.

The wiring layers 61, 61' can be formed in different directions along the barrier region 420d. That is, the wiring layers 61, 61' need not be parallel to each other. As shown in FIG. 6, the wiring layers 61 are formed over the barrier region 420d and the pixel cells 20, 20', whereas the wiring layers 61' are formed over barrier region 420d, but not over the pixel cells 20, 20'.

In the embodiment of FIG. 6, the array 311 includes pixel cells 20, 20'. The pixel cells 20 and 20' are configured differently from each other, as is shown in FIG. 6. Specifically, the photodiode 21 in the pixel cell 20 is differently placed and shaped than the photodiode 21 in the pixel cell 20'. A barrier region 420d is between the pixel cells 20, 20'. In alternative exemplary embodiments, a barrier region 420a, 420b or 420c is between the pixel cells 20, 20'. Also, more than one barrier region 420d can be between the pixel cells 20, 20'. Since there is no need for light to reach barrier region 420d, wiring layers 61, 61' can be formed over any portion of the barrier region 420d. Therefore, the barrier region 420d provides additional space between pixels 20, 20' to permit the wiring layers 61 to accommodate the configurations of each of the pixel cells 20, 20', and also for the wiring layers 61'.

Figure 7:
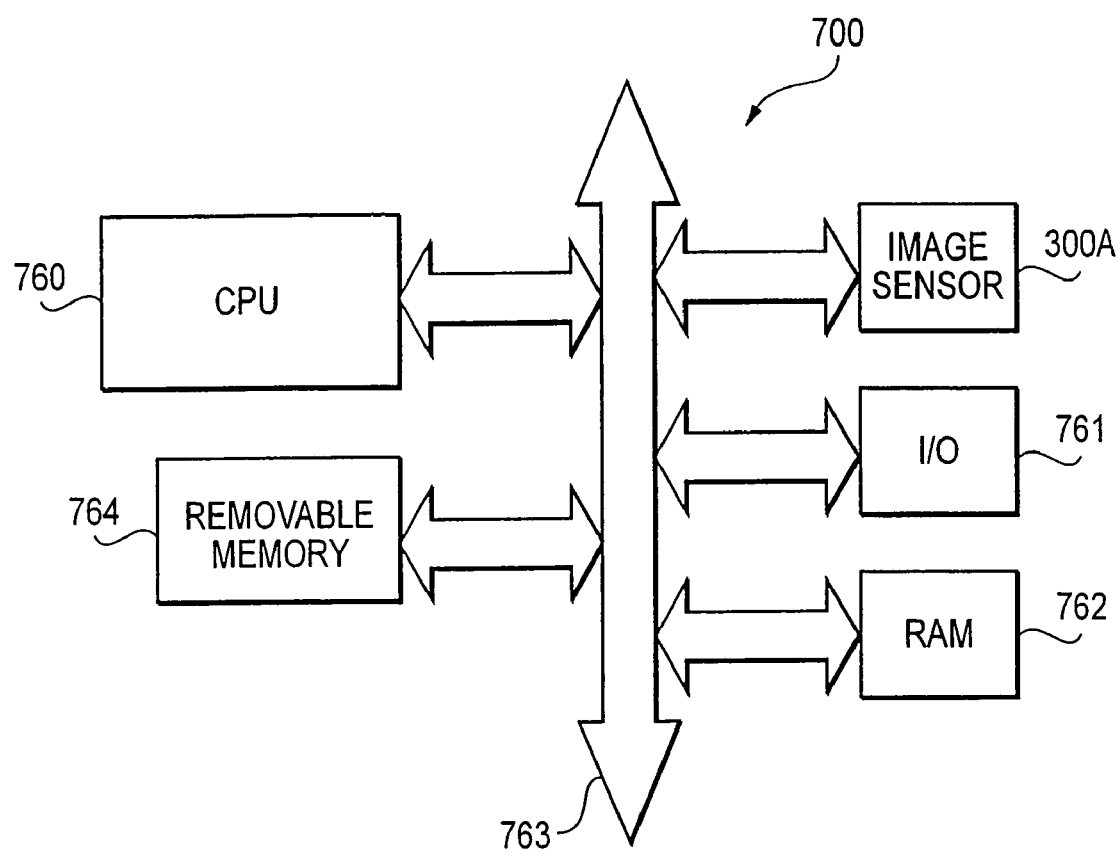
FIG. 7 is a block diagram of a processor system according to an exemplary embodiment of the invention.

FIG. 7 illustrates a processor-based system 700 including an image sensor 300a of FIG. 3A. In an alternative embodiment, the processor based system 700 can include the image sensor 300b of FIG. 3B. The processor-based system 700 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

The processor-based system 700, for example a camera system, generally comprises a central processing unit (CPU) 760, such as a microprocessor, that communicates with an input/output (I/O) device 761 over a bus 763. Image sensor 300a also communicates with the CPU 760 over bus 763. The processor-based system 700 also includes random access memory (RAM) 762, and can include removable memory 764, such as flash memory, which also communicate with CPU 760 over the bus 763. Image sensor 300a may be combined with a processor, such as a CPU, digital signal processor, or microprocessor, with or without memory storage on a single integrated circuit or on a different chip than the processor.

It is again noted that the above description and drawings are exemplary and illustrate preferred embodiments that achieve the objects, features and advantages of the present invention.

It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A method of forming an image sensor, the method comprising:
   providing a substrate;
   providing an array of pixel cells on the substrate, the array comprising an active region of pixels having a first configuration for sensing an image and providing signals representing a sensed image and a black region of pixels having a second configuration which does not provide signals representing the sensed image; and
   forming at least one barrier region by forming a charge accumulation region of a particular conductivity type on the substrate and non-switchably electrically connecting the charge accumulation region to a voltage source terminal, the barrier region completely surrounding at least the pixels in the active region and separating the pixels in the active and black regions.

2. The method of claim 1, wherein the act of forming the charge accumulation region comprises forming either an np or pnp diode.

3. The method of claim 1, wherein the act of forming the charge accumulation region comprises forming the charge accumulation region with n-type conductivity, and wherein the act of electrically connecting the charge accumulation region comprises electrically connecting the charge accumulation region to a positive voltage source terminal.

4. The method of claim 3, wherein the act of forming the charge accumulation region comprises forming the charge accumulation region using an n-type implant dose within the range of approximately $5 \times 10^{12}$ to approximately $1 \times 10^{14}$ atoms/cm$^2$.

5. The method of claim 3, wherein the act of forming the charge accumulation region comprises forming the charge accumulation region using an n-type implant dose within the range of approximately $2 \times 10^{12}$ atoms/cm$^2$ to approximately $1 \times 10^{14}$ atoms/cm$^2$.

6. The method of claim 3, wherein the act of forming the charge accumulation region comprises forming the charge accumulation region using an n-type implant dose greater than approximately $1 \times 10^{14}$ atoms/cm$^2$.

7. The method of claim 1, wherein the act of forming the charge accumulation region comprises forming the charge accumulation region with p-type conductivity, and wherein the act of electrically connecting the charge accumulation region comprises non-switchably electrically connecting the charge accumulation region to a ground voltage source terminal.

8. The method of claim 1, wherein the act of non-switchably connecting the charge accumulation region to a voltage source terminal comprises forming a contact and a metal connection and the act of forming the barrier region comprises forming the contact region of the particular conductivity type below the contact.

9. The method of claim 8, wherein the act of forming the contact region comprises forming the contact region using an n-type implant dose greater than approximately $1 \times 10^{14}$ atoms/cm$^2$.

10. The method of claim 1, further comprising forming at least one wiring layer for routing electrical signals over the barrier region.

11. The method of claim 1, further comprising forming a plurality of wiring layers for routing electrical signals over the barrier region, the plurality of wiring layers not formed parallel to each other.

12. The method of claim 1, further comprising forming at least one wiring layer for routing electrical signals over the first and second pixel cells such that the at least one wiring layer does not block light from reaching the respective photoconversion devices.

13. The method of claim 12, wherein the act of forming the at least one wiring layer comprises forming the at least one wiring layer over the first pixel cell, the at least one barrier region, and the second pixel cell.

14. The method of claim 1, wherein the act of forming the at least one barrier region comprises forming the at least one barrier region as at least a portion of a pixel cell in the array.

15. The method of claim 1, wherein the act of forming the at least one barrier region comprises forming the at least one barrier region as a group of pixel cells in the array and forming a charge accumulation region that is continuous within the substrate between the pixel cells of the group.

16. The method of claim 15, wherein the act of forming the at least one barrier region comprises forming the at least one barrier region as either a row or column of pixel cells.

17. The method of claim 1, wherein the act of forming the at least one barrier region further comprises forming at least one transistor.

18. The method of claim 1, wherein the barrier region separates the active region and black region from peripheral circuitry of the image sensor.

19. The method of claim 1, wherein the array of pixel cells comprises a plurality of black regions and the barrier region separates each from the active region.

20. A method of forming an image sensor, the method comprising:
   providing a substrate;
   forming an array of pixel cells on the substrate, the array comprising an active region of pixels having a first configuration for sensing an image and providing a signal representing a sensed image and a black region of pixels having a second configuration and which does not provide signals representing the sensed image; and
   forming at least one barrier region of pixels on the substrate of the image sensor having a third configuration that is different than the first configuration and second configuration, the at least one barrier region completely surrounding at least the pixels in the active region and black regions and separating the pixels in the active and black regions such that charge transference between them is prevented, and comprising a charge accumulation region electrically connected to a voltage source at a terminal arranged at a location that is different than a location at which the first pixel cells and the second pixel cells are connected to the voltage source.

21. A method of forming an image processor, the method comprising:
   providing a processor; and
   coupling an image sensor to the processor, the image sensor comprising:
      a substrate,
      an array of pixel cells arranged on the substrate, the array comprising a first pixel cell having a first configuration and a black region of pixels having a second configuration, and at least one barrier region arranged on the substrate completely surrounding at least the pixels in the active and black regions and separating the pixels in the active and black regions such that charge transference between them is prevented, the barrier region comprising a contiguous charge accumulation region on the substrate and non-switchably electrically connected to a voltage source terminal.

* * * * *